United States Patent
Ahtee et al.

(10) Patent No.: US 9,415,998 B2
(45) Date of Patent: Aug. 16, 2016

(54) MICROELECTROMECHANICAL STRUCTURE WITH MOTION LIMITER

(71) Applicant: MURATA MANUFACTURING CO., LTD., Nagaokakyo-shi, Kyoto (JP)

(72) Inventors: Ville Ahtee, Espoo (FI); Ville Pekka Rytkönen, Klaukkala (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days.

(21) Appl. No.: 14/630,801

(22) Filed: Feb. 25, 2015

(65) Prior Publication Data
US 2015/0239731 A1 Aug. 27, 2015

(30) Foreign Application Priority Data

Feb. 26, 2014 (FI) ........................... 20145185

(51) Int. Cl.
*H01L 29/84* (2006.01)
*G01C 19/5719* (2012.01)
*G01P 15/097* (2006.01)
*B81B 3/00* (2006.01)
*H04R 23/00* (2006.01)
*G01P 15/125* (2006.01)
*G01P 15/08* (2006.01)

(52) U.S. Cl.
CPC ............. *B81B 3/0051* (2013.01); *G01P 15/125* (2013.01); *H04R 23/00* (2013.01); *B81B 2201/0235* (2013.01); *B81B 2203/051* (2013.01); *G01P 2015/0814* (2013.01); *G01P 2015/0871* (2013.01); *H04R 2201/003* (2013.01)

(58) Field of Classification Search
None
See application file for complete search history.

(56) References Cited

U.S. PATENT DOCUMENTS

| 5,415,043 | A | 5/1995 | Zabler et al. |
|---|---|---|---|
| 2010/0242600 | A1 | 9/2010 | Lin et al. |
| 2011/0219875 | A1 | 9/2011 | Walther et al. |
| 2012/0055249 | A1 | 3/2012 | Miyatake et al. |
| 2012/0216616 | A1 | 8/2012 | Schultz |
| 2012/0223726 | A1 | 9/2012 | Zhang et al. |
| 2012/0280591 | A1 | 11/2012 | Schultz |
| 2013/0019678 | A1 | 1/2013 | Lazaroff et al. |
| 2013/0111992 | A1* | 5/2013 | O'Brien ............. G01P 15/125 73/504.12 |
| 2013/0192370 | A1 | 8/2013 | Yoda |
| 2013/0299923 | A1 | 11/2013 | Classen et al. |

FOREIGN PATENT DOCUMENTS

EP 1 750 132 A1 2/2007

OTHER PUBLICATIONS

Finnish Search Report dated Oct. 14, 2014 corresponding to Finnish Patent Application No. 20145184.

(Continued)

*Primary Examiner* — John C Ingham
*Assistant Examiner* — Ismail Muse
(74) *Attorney, Agent, or Firm* — Squire Patton Boggs (US) LLP

(57) ABSTRACT

A microelectromechanical structure, comprises a first element that includes a first element surface, and a second element that includes a second element surface, and an element gap between the first element surface and the second element surface. At least one of the first element and the second element is mobile. One of the first and second element surfaces includes a convex contact surface and the other one of the first and second element surfaces includes a concave contact surface.

11 Claims, 4 Drawing Sheets

(56) References Cited

OTHER PUBLICATIONS

Finnish Search Report dated Oct. 17, 2014 corresponding to Finnish Patent Application No. 20145186.

Finnish Search Report dated Oct. 15, 2014 corresponding to Finnish Patent Application No. 20145185.

International Search Report application No. PCT/IB2015/051416 mailed May 19, 2015.

* cited by examiner

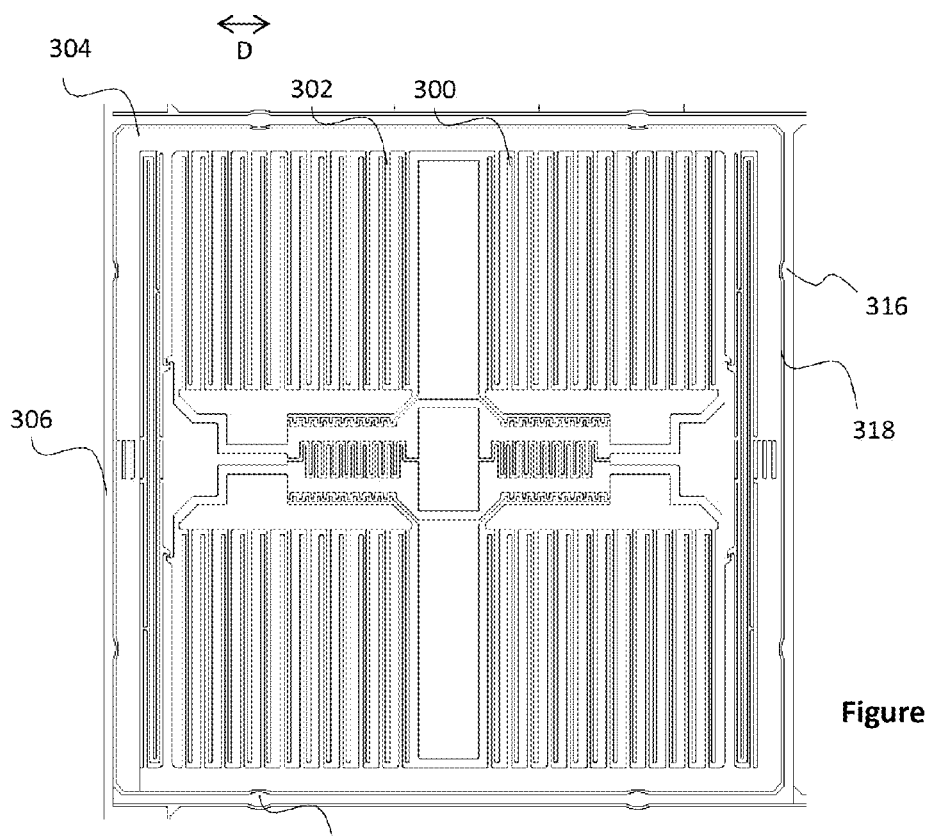
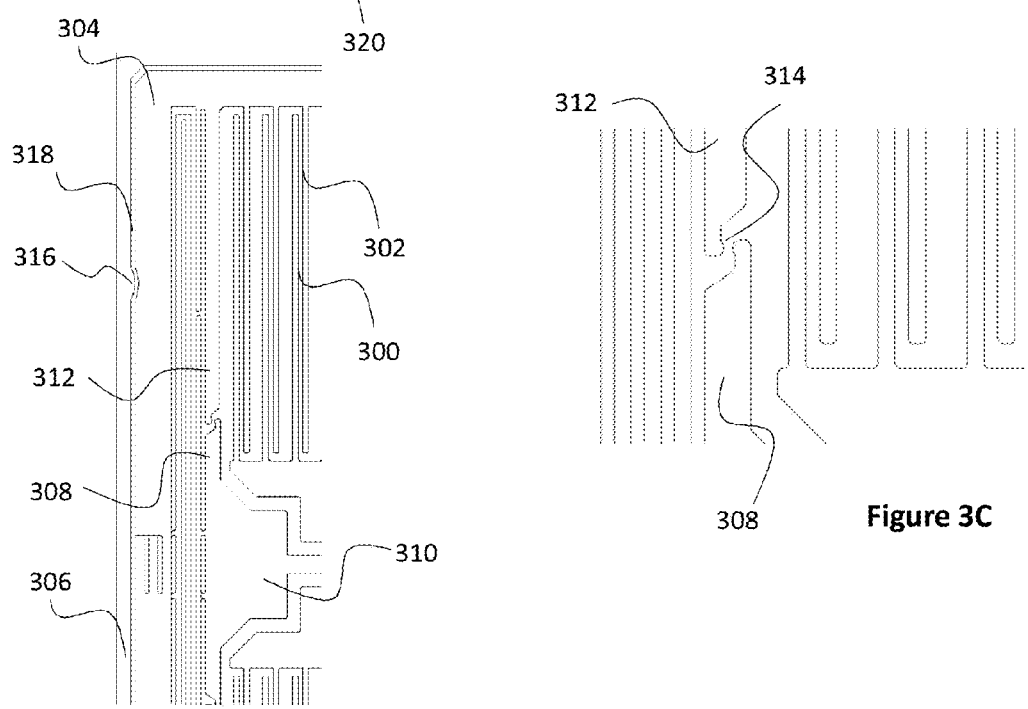
Figure 3A
Figure 3B
Figure 3C

MICROELECTROMECHANICAL STRUCTURE WITH MOTION LIMITER

BACKGROUND

1. Field

The present invention relates to microelectromechanical devices and especially to a microelectromechanical structure and a microelectromechanical device, as defined in the preambles of the independent claims.

2. Description of the Related Art

Microelectromechanical systems, or MEMS can be defined as miniaturized mechanical and electro-mechanical systems where at least some elements have a mechanical functionality. MEMS structures can be applied to quickly and accurately detect very small changes in physical properties.

Motion limiters are commonly used in microelectromechanical structures to control the maximum distance that a movable structure inside a device can displace. Another purpose for motion limiters is to dissipate energy in a controlled way in case a movable part of a MEMS structure collides with an anchored part due to a sudden high acceleration event. Such an event may occur, for example, when a device is accidentally dropped to the floor on a manufacturing line. Design distances between parts are also approached during element testing.

In collision, the primary purpose of a motion limiter is to protect the device from breakage, often by preventing fragile points of structures, e.g., sharp corners or narrow beams touching other surfaces. However, the motion limiter itself may also break if it is not robust enough. The robustness of a motion limiter can be enhanced, for example, by applying a hard coating over the structure, or by increasing the contact area between the contacting surfaces. The use of coatings is restricted to a limited number of cases only and cannot be conveniently applied when the contacting bodies are designed to move laterally within a single structural layer. On the other hand, increasing the contact area between the surfaces increases the risk of stiction between the contacting surfaces.

Traditionally a lateral motion limiter consists of a surface, which is locally raised from its environment. The contact surface of such a design has traditionally been flat or convex in shape.

Design with a flat contact surface gives a good protection against breakages when the relative movement of the contacting bodies is normal to the surface of the motion limiter and the contacting bodies are not laterally tilted. However, in case the bodies contact in an angle, the area of the contact surface is drastically reduced and the risk of breakage of the motion limiter is increased.

Use of convex shape motion limiters reduces the dependence of the contact area on the contact angle. However, the obtainable contact area becomes relatively small, unless the radius of the curvature of the limiter surface is made very large, which is unpractical in most of the cases.

SUMMARY

An object of the present invention is to provide an effective and robust motion limiter mechanism for microelectromechanical systems. This and other objects of the present invention are achieved with a microelectromechanical structure and a microelectromechanical device according to the claims.

The claims define a microelectromechanical structure, which comprises a first element that includes a first element surface, and a second element that includes a second element surface, and an element gap between the first element surface and the second element surface. At least one of the first element and the second element is mobile. One of the first and second element surfaces includes a convex contact surface and the other one of the first and second element surfaces includes a concave contact surface.

The claims also define a micromechanical device that includes the microelectromechanical structure.

The present invention also includes a configuration that provides matching or nearly matching curved surfaces on motion limiter counterparts. One surface of the structure is convex and the other is concave. The structure provides improved mechanical robustness with optimal use of element space.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which

FIG. 2b shows an enlarged detail from the section of FIG. 2a;

FIGS. 3A to 3C illustrate details of another embodiment of the invention;

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical structures that are generally known to a person skilled in the art may not be specifically described herein.

Figure 1:
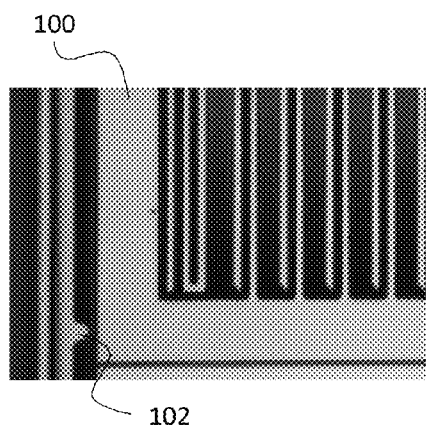
FIG. 1 shows a section of a conventional microelectromechanical structure applicable for inertial sensing.

FIG. 1 shows a section of a conventional microelectromechanical structure applicable for inertial sensing. In order to create mechanical energy to be transformed into signals, a microelectromechanical structure includes at least one mobile element 100. A mobile element 100 refers here to a structural entity that is suspended to a support by means of a suspension spring structure, and may move in respect of the support. The mobile element 100 is typically suspended such that its movement remains, in normal conditions, within defined structural design limits. However, for special situations, the microelectromechanical structure may comprise also motion limiters 102. Their task is to control the maximum distance that the mobile structure can displace, and/or dissipate energy in a controlled way when the design limits are exceeded. The motion limiter may be an anchored element rigidly attached to the support, or a mobile element suspended to the support.

Figure 2A:
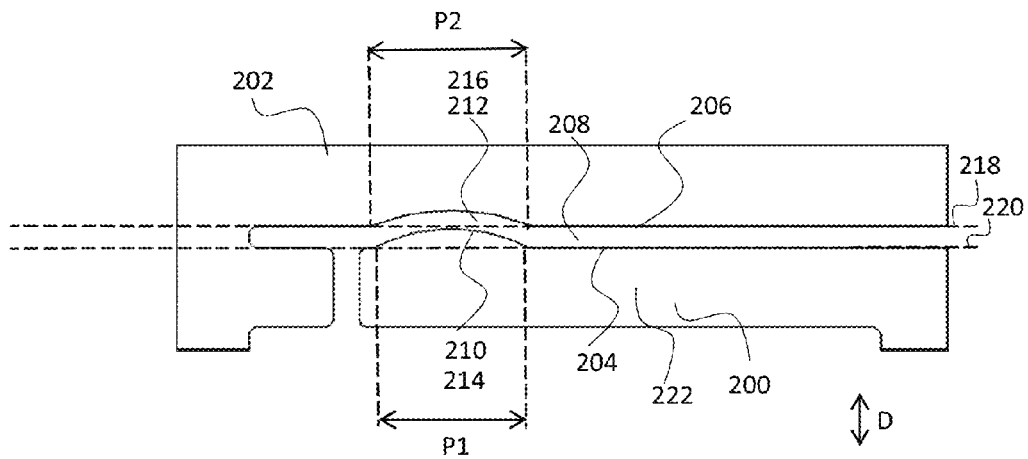
FIG. 2a shows a section of an embodiment of a microelectromechanical structure.

FIG. 2a illustrates a section of an embodiment of a microelectromechanical structure according to the invention. The microelectromechanical structure includes a first element 200 and a second element 202, of which at least one is mobile. In the exemplary embodiment of FIG. 2a, the first element 200 is an anchored element. An element used as a motion limiter may be rigidly or resiliently anchored to the support. The motion limiter 102 of FIG. 1 is an example of rigid anchoring, and the first element 200 of FIG. 2a an example of resilient anchoring.

In FIG. 2a, the second element 202 is a mobile element suspended to a support structure to undergo inertial motion. The support structure may be provided by another body element of a microelectromechanical device, for example, by an underlying handle wafer, or a covering cap wafer, patterned separately or in combination from a layered silicon-on-insulator substrate. The mobile element 202 may be suspended to the support through a suspension spring structure that is flexible to displacements of the seismic mass in at least one direction, and very rigid to displacements of the seismic mass in other directions. A suspension spring structure may suspend the mobile element for motion with a degree of freedom, for example, in an out-of-plane direction, or in one or more in-plane directions. Motion of the seismic mass may be limited in a first direction D shown in FIG. 2a. The first direction D may be parallel to the direction of a designed motion (degree of freedom) and/or to one or more directions in which the suspended seismic mass may move unintentionally.

The first element 200 includes a first element surface 204, and the second element 202 includes a second element surface 206. The first element surface 204 and the second element surface 206 are placed opposite to each other such that an element gap 208 is formed between them. It is understood that the example FIG. 2a describes first and second elements as layer elements etched into a structural layer. The first and second element surfaces 204, 206 of FIG. 2a may thus be side surfaces of the layer elements. The first element surface 204 may be aligned to a first curve with a defined curvature, and the second element surface 206 may be aligned to a second curve with the same or different curvature. In the exemplary configuration of FIG. 2a, both the first curve and the second curve are straight lines with null curvature, but other combinations or curvatures may be applied within the scope. The first element surface 206 is shown aligned to a first line 218 and the second element surface aligned to a second line 220. The first line 218 and the second line 220 are parallel to each other, and the first direction D is perpendicular to the first line 218 and the second line 220.

In embodiments of the invention, one of the element surfaces includes a protrusion, and the other one includes an indentation. A protrusion refers here to a structural part that is locally raised from an element surface and thus extends farther towards the opposite element surface than the element surface. An indentation refers here to a recess in an element surface. In FIG. 2a, the first surface 204 includes a protrusion 210 and the second surface 206 includes an indentation 212, but the arrangement is exemplary only. Within the scope, the protrusion may be in the mobile element and the indentation may be in the anchored motion limiter element, or vice versa.

The surface of the protrusion 210 extends towards the element gap 208 and includes a first curved region 214. The surface of the indentation 212 is also towards the element gap 208, and includes a second curved region 216. Advantageously, but not necessarily, the first curved region 214 extends over the whole surface of the protrusion 210 and the second curved region 216 extends over the whole surface of the indentation 212, as shown in FIG. 2a. The first curved region 214 is aligned to a third curve and the second curved region 216 is aligned to a fourth curve. The third curve has a radius of curvature that is different from the first element surface 204 and the fourth curve has a radius of curvature that is different from the second element surface 206. The protrusion 210 can thus in this context be identified as a region in the first element that includes a first curved region 214, which region has a different radius of curvature than the curvature of the first element surface 204. Correspondingly, the indentation 212 can be identified as a region in the second element that includes a second curved region 216, which region has a different radius of curvature than the curvature of the second element surface 206.

The protrusion and the indentation are aligned such that projection P1 of the first curved region and projection P2 of the second curved region on an element surface at least partly coincide. In FIG. 2a, the protrusion 210 is shown aligned to the indentation 212 in such a manner that the projection P1 of the first curved region 214 (here also the surface of the protrusion 210) is included within the projection P2 of the second curved region (here also the surface of the indentation 212). The projections P1, P2 may be considered to be taken on the curvature of the first element surface 204 or of the second element surface 206.

The third and fourth curves can optionally have a symmetrical form, for example, circular or elliptical form. If the curve is elliptical, the minor axis of the ellipse can coincide with the bottom of the indentation. A circular curve has a constant radius of curvature, and the radius of curvature of an elliptical curve varies with the distance from the minor axis, when the minor axis coincides with the bottom of the indentation, or from the major axis, when the major axis coincides with the bottom of the indentation.

Let us denote that a radius of curvature in a vertex of the third curve, and therefore also of the first curved region 214 is the first radius of curvature R1. The term vertex is used herein to refer to a local extreme point of a curve. Correspondingly, a radius of curvature in a vertex of the fourth curve, and therefore also of the second curved region 216, is the second radius of curvature R2. The first curved region 204 and the second curved region 206 can be aligned such that an axis connecting the vertex of the first curved region and the vertex of the second curved region is parallel to the first direction D. The first radius of curvature R1 of the protrusion 210 can be smaller than the second radius of curvature R2 of the indentation 212.

Accordingly, in the disclosed configuration, the protrusion 210 may be considered to provide a convex contact surface and the indentation 212 may be considered to provide a concave contact surface. If the microelectromechanical structure is exposed to forces that try to move the mobile element beyond the design limits, the convex surface and the concave surface are brought into contact. The contact area between the convex and concave surfaces is dependent on the ratio R. The ratio R, i.e. the contact area can now be dimensioned to be large, which significantly reduces the risk of breakages of the structures at contact. This is an important design factor for the motion limiter. Thinking conventionally, in order to reduce stiction between the contacting surfaces to be able to measure very small accelerations, one might consider adjusting the ratio R small, so that the contact area is minimized. However, in many applications, actually the durability of the motion limiter element is the critical factor.

Figure 2B:
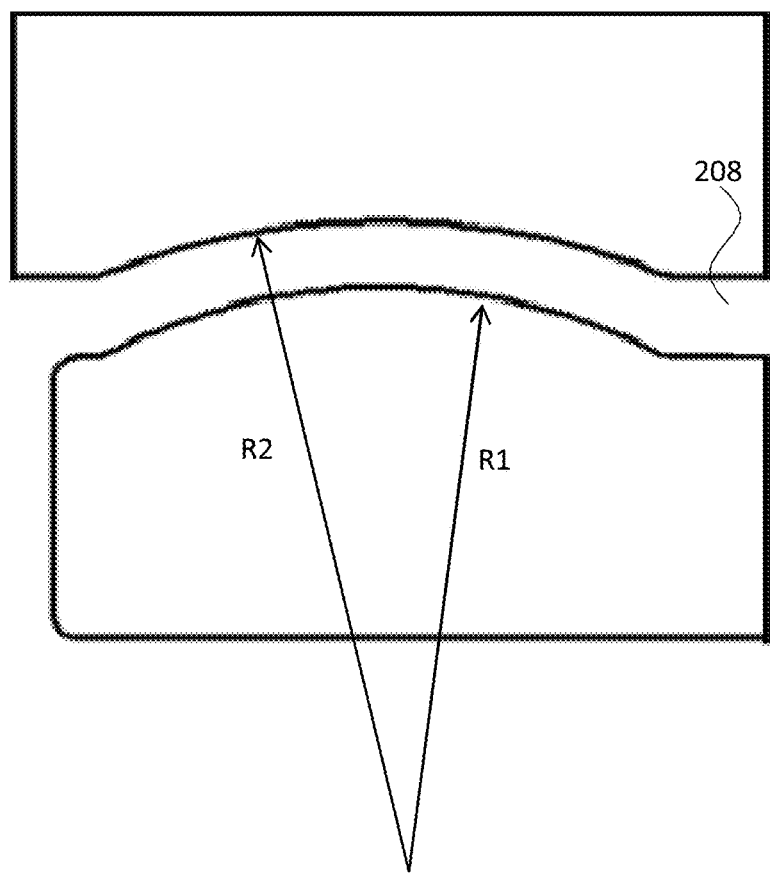

FIG. 2b shows an enlargement of a part of the section shown in FIG. 2a. As can be seen in FIG. 2b, both the first radius of curvature R1 of the protrusion 210 and the second radius of curvature R2 of the indentation 212 have been arranged to be considerably greater than the gap 208 between the surfaces. It has been detected that in such configuration, at the time of contact, the protrusion penetrates into the indentation, and begins to press against it. Due to elasticity, and the close alignment of the large radii, the contact area between the contacting surfaces increases very rapidly. The increased contact area divides the force of impact to a large area and therefore reduces the risk of breakage of the contacting surfaces. This increased robustness is achieved when the a ratio R=R1/R2 of the first radius of curvature R1 and the second radius of curvature R2 is preferably within an inclusive range of 0.5 to 1, and the first radius of curvature R1 and the second radius of curvature R2 are is at least two times the width of the gap 208.

In an aspect, the protrusion with smaller radius of curvature can, to an extent, move laterally without compromising the compatibility of the contact surfaces. This effectively reduces the risk of breakages due to small transversal displacements of the elements before the contact.

The configuration thus enables an effective and at the same time very robust motion limiter solution.

Elasticity of the material of the motion limiter provides some inherent resiliency to the configuration, but that is seldom enough. In order to enhance the robustness of the structure, the motion limiter configuration of the microelectromechanical structure may include a further flexural element that absorbs some of the motion energy in case of contact. FIG. 2a illustrates a configuration where the first element 200 that is anchored to the support includes a flexural beam 222. One end of the flexural beam 222 is connected to the anchoring, and in the opposite lateral end of the flexural beam is the protrusion 210. The flexural beam 222 extends in a direction perpendicular to the first direction D, and the protrusion 210 is in a side surface of the lateral end of the flexural beam 222. It is noted that the configuration of FIG. 2a is illustrative only. The flexural beam may be coupled (connected or included into) to the mobile element or the motion limiter, and in either of the cases carry a protrusion or an indentation. When the first curved region 210 and the second curved region 212 get into contact, the flexural beam bends. While bending, the flexural beam absorbs kinetic energy of the mobile element such that breakage of the contacting elements can be avoided.

Stiction refers in general to an adhesive force that needs to be overcome to enable motion of an adhered moving element. At contact, the contacting surfaces press against each other, and some threshold of force is needed to overcome static cohesion. Also, when surfaces of micro-scale elements come into close proximity, the surfaces may adhere to each other. The new configuration allows also an optimal way to restore the mobile element back to motion after contact, thereby eliminating or at least efficient reduction of risk of stiction.

Depending on the application, a required restoring force to restore the mobile element back to motion after contact may be provided by the suspension spring structure, by an additional flexural element, or the restoring force may be provided by a combination of each. For example, when the first direction D coincides with the designed direction of motion of the seismic mass, the spring constant of the suspension spring structure is inherently minimal. For these situations, the microelectromechanical structure may include two impact elements that provide successively activated motion limiter stages that require different restoring forces. In other directions, like in a cross-axis direction that is perpendicular to the designed direction of motion of the seismic mass, the suspension spring structure is typically very rigid and thereby able to provide a strong restoring force whenever driven off equilibrium. In these directions, the mobile element tends to return back to motion after contact without additional restoring forces.

FIG. 3A illustrates an exemplary microelectromechanical structure with an efficient two-staged motion limiting scheme. FIG. 3B shows an enlarged section marked in FIG. 3A, and FIG. 3C shows a further enlarged section marked in FIG. 3B.

As may be seen from FIG. 3A, the microelectromechanical structure may include a comb structure with stator combs 300 and mobile rotor combs 302. The mobile rotor combs 302 may extend inwards from a rotor frame 304. The rotor frame 304 may be surrounded by an anchored structure frame 306. In this example, motion limiter stages for motions in a first direction D are described. The rotor frame 304 is shown to have a degree in freedom in a horizontal direction, which is parallel to the first direction D. It is understood that motion may be limited in other directions, as well. For example, FIG. 3A shows a microelectromechanical structure that includes impact elements 320 for motions of the rotor frame 304 in a direction perpendicular to the first direction.

For a first motion limiter stage, the microelectromechanical structure may include a first impact element. As shown in FIG. 3B, the first impact element may include a first flexural beam 308, one end of which is coupled to an anchor 310. The microelectromechanical structure may also include a second flexural beam 312, one end of which is coupled to the rotor frame 304. A first limiter gap refers here to a distance that a mobile element needs to be displaced in a specific direction to induce contact in the first impact element. As shown in FIG. 3B, the lateral end of the first flexural beam 308 and the lateral end of the second flexural beam 312 may be separated by a first limiter gap 314. As shown in FIG. 3C, in order to save space, the lateral ends of the flexural beams 308, 312 may be narrowed such that the total width required the narrowed ends of the flexural beams do not significantly differ from the non-narrowed width of the flexural beams 308, 312.

For a second motion limiter stage, the microelectromechanical structure may include a second impact element. A second limiter gap refers here to a distance that a mobile element needs to be displaced in the same specific direction to induce contact in the second impact element. As shown in FIGS. 3A and 3B, as second impact elements, the anchored structure frame 306 may include one or more frame protrusions 316 separated from the rotor frame 300 by a second limiter gap 318. To enable correct order of contact, the second limiter gap 318 is preferably greater than the first limiter gap 314. The first limiter gap 314 and the second limiter gap 318 may extend in a same direction and thus increase and decrease similarly in response to motion of the mobile element in the first direction D.

Thus, in cases of minor deviations from the design limits, the rotor frame 304 may move in direction D, whereupon the first limiter gap 314 closes, the flexural beams 308, 312 get into contact with each other and oppose the excessive motion. Due to the extent of the contacting surfaces of the first flexural beam 308 and the second flexural beam 312, the adhesive force between them is minimal. The first motion limiter stage thus optimally avoids stiction while the restoring force by the suspension spring structure is enough to pull the elements apart after contact. The restoring force of the flexural beam may be arranged to be large enough to appear practically rigid in the first direction D in normal overload situations.

In case motion of the mobile element 304 is larger, the second limiter gap 318 closes, and the frame protrusions 316 eventually come into contact with the rotor frame 304. Advantageously, the spring constant of the first impact element (the flexural beams 308, 312) in a first motion limiter stage is adapted to provide a restoring force large enough to overcome the adhesive force between the contacting surfaces in the second impact element, and pull the mobile element back to motion after contact.

Due to the compact combination of a convex contact surface in the anchored structure frame 306 a concave contact surface in the rotor frame 304, the second motion limiter stage provide optimal robustness to limit highly excessive motion, as described with FIG. 2a. The combination of the differently optimized motion limiter stages can be implemented in minimal layer surface area. In combination, the two stages enable excellent motion limiting and efficient recovery after a variety of operational disturbances.

Figure 4:
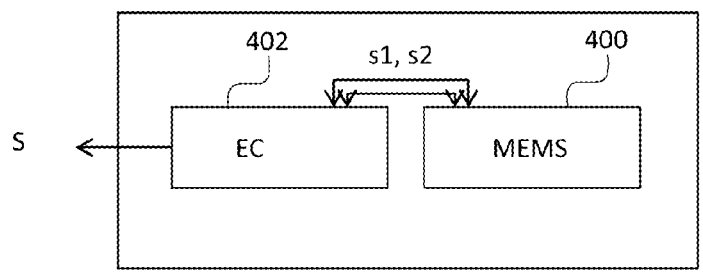
FIG. 4 illustrates elements of a microelectromechanical device that includes the microelectromechanical structure.

The schematic of FIG. 4 illustrates elements of an exemplary microelectromechanical device that includes the microelectromechanical structure described with FIGS. 2 and 3. The microelectromechanical device may include a first part 400 and a second part 402. The first part 400 may include mechanical elements, including the microelectromechanical structure. The second part 402 may include an electrical circuit that is connected to input electrical signals from the microelectromechanical structure. As shown in FIG. 4, one or more signals created within the first part may be input to the electrical circuit of the second part 402. The one or more signals input to the electrical circuit may be used to produce a signal S representing a measurement result of the inertial sensor.

The microelectromechanical device may be included in a combined sensor element that includes a variety of sensor elements, a wired or mobile computing, gaming or communication device, a measurement device, a rendering device, or a vehicle function control unit, to name a few.

It is apparent to a person skilled in the art that as technology advances, the basic idea of the invention can be implemented in various ways. The invention and its embodiments are therefore not restricted to the above examples, but they may vary within the scope of the claims.

The invention claimed is:
1. A microelectromechanical structure, comprising:
a first element that includes a first element surface, and a second element that includes a second element surface, wherein at least one of the first element and the second element is mobile;
an element gap between the first element surface and the second element surface; wherein
one of the first and second element surfaces includes a convex contact surface and the other one of the first and second element surfaces includes a concave contact surface;
the convex contact surface includes a protrusion, and the concave contact surface includes an indentation;
the surface of the protrusion includes a first curved region;
the surface of the indentation includes a second curved region;
a radius of curvature in a vertex of the first curved region is a first radius of curvature;
a radius of curvature in a vertex of the second curved region is a second radius of curvature;
the first radius of curvature is smaller than the second radius of curvature such that the ratio of the first radius of curvature and the second radius of curvature is within a range of 0.5 to 1, and both the first radius of curvature and the second radius of curvature are at least two times the width of the element gap;
the microelectromechanical structure includes two impact elements for providing successively activated motion limiter stages, at least one of the impact elements including the convex contact surface and the concave contact surface;
a first impact element includes a flexural element and is induced into contact by closing of a first limiter gap in response to displacement of the mobile element in a specific direction;
a second impact element is induced into contact by closing of a second limiter gap in response to displacement of the mobile element in the specific direction, the second limiter gap being greater than the first limiter gap.

2. The microelectromechanical structure of claim 1, wherein one of the first and second elements comprises an anchored element and the other of the first and second elements comprises a mobile suspended element.

3. The microelectromechanical structure of claim 1, wherein the first element and the second element comprise mobile suspended elements.

4. The microelectromechanical structure of claim 2, further comprising a suspension spring structure supporting the suspended element for motion with a degree of freedom.

5. The microelectromechanical structure of claim 4, wherein the first element surface is aligned to a first line, the second element surface is aligned to a second line, and wherein the first line and the second line are parallel to each other.

6. The microelectromechanical structure of claim 1, wherein the first element comprises a structural layer element, and wherein the first element surface comprises a side surface of the structural layer element.

7. The microelectromechanical structure of claim 1, wherein the protrusion extends to the element gap, and wherein the indentation comprises a recess that extends away from the element gap.

8. The microelectromechanical structure of claim 5, wherein the first curved region and the second curved region are aligned such that an axis connecting a vertex of the first curved region and a vertex of the second curved region is aligned to a first direction that is perpendicular to the first line and the second line.

9. The microelectromechanical structure of claim 1, wherein the projection of the first curved region is within the projection of the second curved region on the first or the second element surface.

10. The microelectromechanical structure of claim 1, wherein the flexural element provides a spring constant in the specific direction, the spring contact being configured to provide a restoring force greater than adhesive force of the contact in the second impact element.

11. A microelectromechanical device, comprising the microelectromechanical structure of claim 1.

* * * * *